United States Patent
Shu et al.

(10) Patent No.: US 8,214,013 B2
(45) Date of Patent: *Jul. 3, 2012

(54) ACCELERATED SHELLS TRAJECTORY MRI ACQUISITION

(75) Inventors: Yunhong Shu, Rochester, MN (US); Matthew A. Bernstein, Rochester, MN (US)

(73) Assignee: Mayo Foundation for Medical Education and Research, Rochester, MN (US)

(*) Notice: Subject to any disclaimer, the term of this patent is extended or adjusted under 35 U.S.C. 154(b) by 1148 days.

This patent is subject to a terminal disclaimer.

(21) Appl. No.: 12/018,899

(22) Filed: Jan. 24, 2008

(65) Prior Publication Data

US 2008/0183067 A1  Jul. 31, 2008

Related U.S. Application Data

(63) Continuation-in-part of application No. 11/780,126, filed on Jul. 19, 2007, now Pat. No. 8,095,202.

(60) Provisional application No. 60/897,622, filed on Jan. 26, 2007.

(51) Int. Cl.
*A61B 5/055* (2006.01)

(52) U.S. Cl. ......................... 600/410; 324/309

(58) Field of Classification Search .................. 600/410; 324/309

See application file for complete search history.

(56) References Cited

U.S. PATENT DOCUMENTS

| | | | |
|---|---|---|---|
| 5,122,747 A * | 6/1992 | Riederer et al. | ............. 324/309 |
| 5,532,595 A | 7/1996 | Lampman et al. | |
| 5,713,358 A | 2/1998 | Mistretta et al. | |
| 5,830,143 A | 11/1998 | Mistretta et al. | |
| 5,873,825 A | 2/1999 | Mistretta et al. | |
| 5,881,728 A | 3/1999 | Mistretta et al. | |
| 6,295,465 B1 | 9/2001 | Simonetti | |
| 6,801,036 B2 | 10/2004 | Meyer | |

OTHER PUBLICATIONS

Shu et al., Three-Dimensional MRI With an Undersampled Spherical Shells Trajectory; Magn. Reson. Med. 2006, 56;553-562.*
Andrew V. Barger et al, Time-Resolved Contrast-Enhanced Imaging with Isotropic Resolution and Broad Coverage Using an Undersampled 3D Projection Trajectory; MRM 48:297-305 (2002.
Jin Hyung Lee et al, Fast 3D Imaging Using Variable-Density Spiral Trajectories With Application to Limb Perfusion; MRM 50:1276-1285 (2003).
Daniel W. Petrie et al, Optimizing Spherical Navigator Echoes for Three-Dimensional Rigid-Body Motion Detection; MRM 53:1080-1087(2005).

* cited by examiner

*Primary Examiner* — Jonathan Cwern
(74) *Attorney, Agent, or Firm* — Quarles & Brady LLP

(57) ABSTRACT

A method for prescribing a scan on an MRI system includes selecting a general pulse sequence to be used during a time-resolved imaging process of a subject using an MRI system. The method also includes setting a first set of scan parameters to more specifically prescribe the general pulse sequence and setting a second set of scan parameters using a formula that relates time resolution and spatial resolution resulting from the first set of scan parameters. The method then includes performing the time-resolved imaging process using the general pulse sequence, the first set of scan parameters, and the second set of scan parameters.

18 Claims, 6 Drawing Sheets

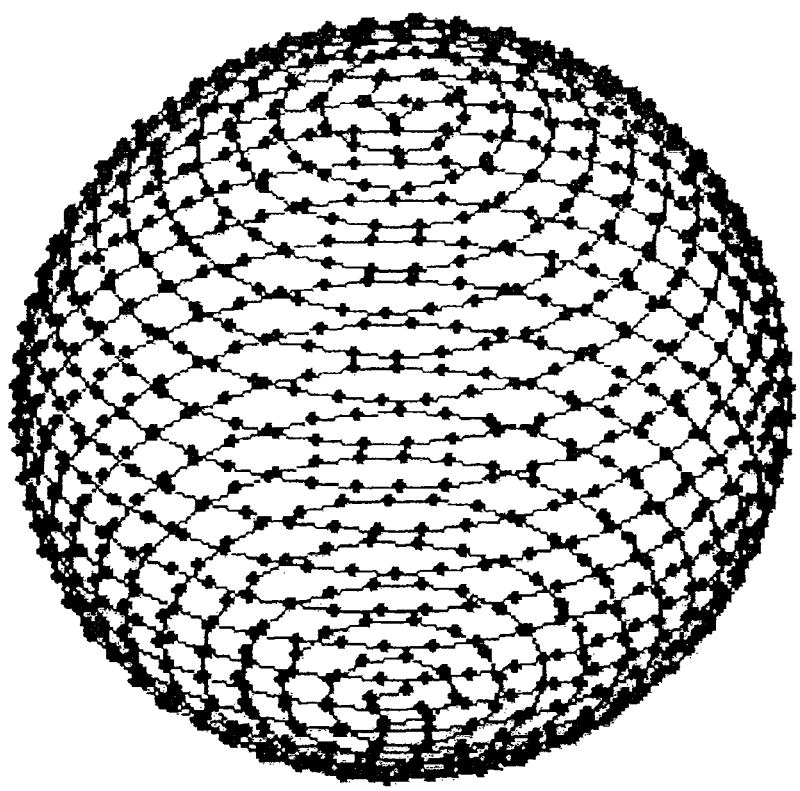
FIG. 2
FIG. 3
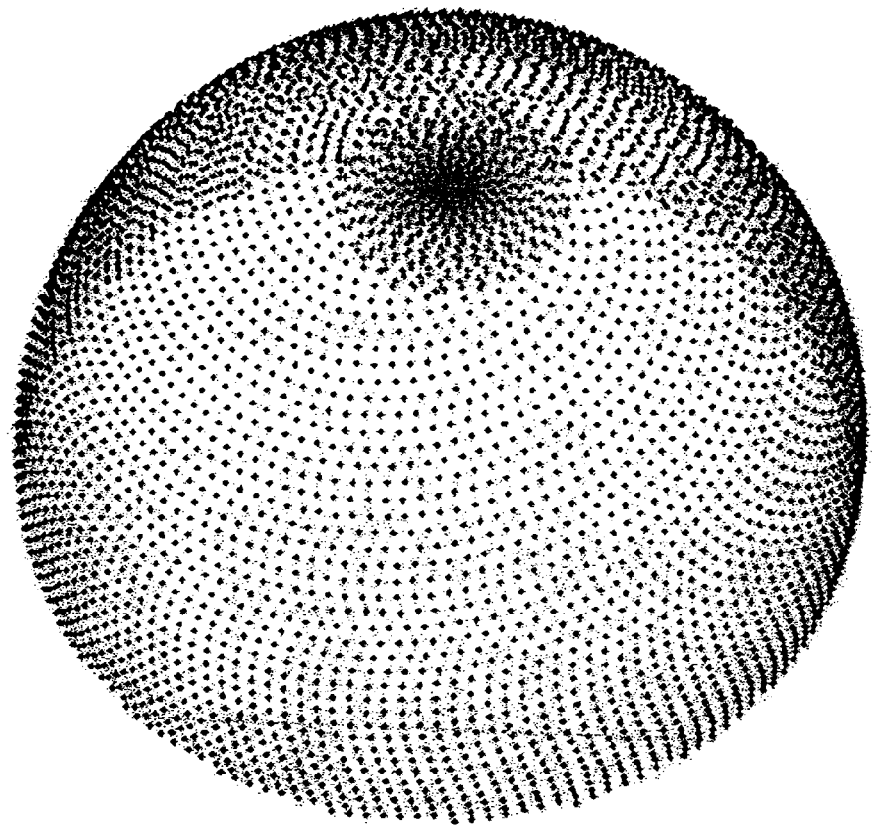

ACCELERATED SHELLS TRAJECTORY MRI ACQUISITION

CROSS-REFERENCE TO RELATED APPLICATIONS

This application is based on U.S. Provisional Patent Application Ser. No. 60/897,622 filed on Jan. 26, 2007, and entitled "ACCELERATED SHELL TRAJECTORY MRI ACQUISITION," and claims the benefit thereof and is a continuation-in-part of U.S. patent application Ser. No. 11/780,126, filed Jul. 19, 2007 now U.S. Pat. No. 8,095,202, and entitled "ACCELERATED SHELLS TRAJECTORY MRI ACQUISITION."

BACKGROUND OF THE INVENTION

The field of the invention is nuclear magnetic resonance imaging (MRI) methods and systems. More particularly, the invention relates to the rapid acquisition of three-dimensional MR images using a shells sampling trajectory.

Any nucleus that possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant γ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_Z$ is produced in the direction of the polarizing field, but the randomly oriented magnetic components in the perpendicular, or transverse, plane (x-y plane) cancel one another. If, however, the substance, or tissue, is subjected to a magnetic field (excitation field B1) which is in the x-y plane and which is near the Larmor frequency, the net aligned moment, Mz, may be rotated, or "tipped", into the x-y plane to produce a net transverse magnetic moment $M_t$, which is rotating, or spinning, in the x-y plane at the Larmor frequency. The practical value of this phenomenon resides in the signal which is emitted by the excited spins after the pulsed excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified. The acquisition of the NMR signals samples is referred to as sampling k-space, and a scan is completed when enough NMR cycles are performed to fully sample k-space.

In conventional, fully-sampled MRI, the number of acquired k-space data points is determined by the spatial resolution requirements, and the Nyquist criterion for the alias-free field of view (FOV). Images can be reconstructed, however, using a reduced number of k-space samples, or "undersampling". The term undersampling here indicates that the Nyquist criterion is not satisfied, at least in some regions of k-space. Undersampling is used for several reasons, including reduction of acquisition time, reduction of motion artifacts, achieving higher spatial or temporal resolution, and reducing the tradeoff between spatial resolution and temporal resolution. Aliasing artifacts that result from undersampling are not as severe if the violation of the Nyquist criterion is restricted to the outer part of k-space.

The time required to fully sample 3D Cartesian k-space is relatively long. This reduces the temporal resolution of time-resolved studies that acquire the same imaging volume repeatedly. Well-known undersampling methods that are used to improve the temporal resolution of time-resolved acquisitions include the 3D TRICKS (3D time-resolved imaging of contrast kinetics) method described by Korosec F R, Frayne R, Grist T M, and Mistretta C A in: Time-resolved contrast-enhanced 3D MR angiography, Magn Reson Med. 1996 September; 36(3):345-51, and BRISK as described by Doyle M, Walsh E G, Blackwell G G, Pohost G M in: Block regional interpolation scheme for k-space (BRISK): a rapid cardiac imaging technique Magn Reson Med. 1995 February; 33(2): 163-70. Both of these methods sample data at the periphery of k-space less frequently than at the center, but neither method provides a quantitative criterion to specify the sampling frequency.

Alternative non-Cartesian trajectories can also provide faster coverage of k-space, and more efficient use of the gradients. When a very fast volume acquisition is required, undersampling strategies can be used in conjunction with these non-Cartesian trajectories to further reduce the scan time. The method of Lee J H, Hargreaves B A, Hu B S, Nishimura D G; Fast 3D Imaging Using Variable-Density Spiral Trajectories With Applications To Limb Perfusion, Magn. Reson. Med. 2003; 50(6): 1276-1285, uses a variable-density stack of spiral trajectories that varies the sampling density in both the $k_x$-$k_y$ plane and the $k_z$ direction. That method preserves reasonable image quality, while reducing the acquisition time by approximately half compared to a fully-sampled acquisition. Vastly undersampled 3D projection acquisition as described by Barger V A, Block W F, Toropov Y, Grist T M, Mistretta C A, Time-Resolved Contrast-Enhanced Imaging With Isotropic Resolution and Broad Coverage Using An Undersampled 3D Projection Trajectory, Magn. Reson. Med. 2002; 48(2):297-305, has been used to increase temporal resolution and provide better dynamic information for 3D contrast-enhanced MRA. The aliasing caused by undersampling in this method often can be tolerated in angiographic applications. This is because the vessel-tissue contrast is high and the artifacts are distributed, or spread out in the image.

One such method is disclosed in U.S. Pat. No. 5,532,595, which is incorporated herein by reference. This so-called "shells" k-space sampling trajectory samples a spiral pattern in k-space around a spherical surface. A complete image acquisition is comprised of a series of such spiral sampling patterns over a corresponding series of spheres of increasing diameter. The shells k-space sampling trajectory acquires 3D data on concentric spherical surfaces in k-space. It was originally proposed in the mid-1990's, but its feasibility for image acquisition has only recently been demonstrated. The shells k-space trajectory has favorable properties for motion correction and accelerated acquisition with undersampling.

A limitation on the use of the shells sampling pattern is its sensitivity to off-resonance effects. Protons in lipids (fat) resonate at a Larmor frequency that is approximately 145 Hz/T lower than protons in water. Consequently, at 1.5 T, the protons from fat are off-resonance by approximately 217 Hz. For standard Cartesian acquisitions, this causes a simple spatial shift in the frequency encoded direction, but for non-Cartesian acquisitions, like shells, it causes blurring. Fat suppression methods like CHESS can be used, but they add approximately 10 ms or more to the repetition time (TR). For applications like contrast enhance MR angiography, a short TR time is required and CHESS fat sat is not practical. Because the $T_1$ of fat is longer than the $T_1$ of contrast enhanced arterial blood (e.g., approximately 250 ms vs. 50 ms at a field strength of 1.5 T), using the shortest possible TR (e.g., 5 ms or less) provides a useful degree of fat suppression due to well-known saturation effects that can be readily calculated, for example, assuming spoiled gradient echo contrast.

Reducing the readout duration during which data are acquired also reduces blurring from off-resonance effects, such as the chemical shift of lipids mentioned above, and also from susceptibility variation. A standard method to reduce the readout duration is to increase the readout bandwidth (BW), but this has limitations in terms of signal-to-noise ratio (proportional to $1/\sqrt{BW}$), maximum gradient amplitude, and slew rate available on any given set of gradient hardware, and peripheral nerve stimulation from increased gradient stewing.

Therefore, it would be desirable to have a system and method to identify imaging settings that will produce a desirable image, when utilizing an undersampling strategy in conjunction with these non-Cartesian trajectories to control scan time.

SUMMARY OF THE INVENTION

The present invention is a method for acquiring 3D MR image data using a series of shell sampling patterns. One aspect of the present invention enables a shorter TR and signal readout duration for the central shells by using a variable TR. This is particularly important because the central shells cover the central portion of k-space, which governs the low spatial frequencies and overall contrast of the images. Consequently, reducing the contribution of fat signal and other off-resonance effects by shortening the TR for the central shells has a disproportionately beneficial effect for reducing artifacts.

In the shells acquisition, the surfaces of the shells are covered with helical spiral k-space trajectories. In the proposed invention, readout duration and TR is reduced for the central shells by realizing that fewer sampling points are required to cover the surface of the smaller, central shells, while still satisfying the Nyquist criterion as shown in FIG. 2. Consequently, at a fixed receiver bandwidth, the readout duration for the innermost shells are also reduced. For example, if a total of 128 shells are required, one can acquire 256 complex k-space sample points per TR for each of the innermost 10 shells, and then increase to 512 complex sample points for each TR in shell numbers 11-128. In fact, even with 512 sample points per TR, multiple interleaves may be required to cover the larger shells as shown in FIG. 3. In this example, the TR for the innermost shells may be reduced, for example, to approximately 5 ms, while the TR for the outer shells may be 8 ms. The readout time is similarly reduced, for example, from 4 ms to 2 ms for the central shells assuming a typical readout bandwidth of ±64 kHz. The reduction of 3 ms in TR for this example helps suppress fat signals, and allows for higher spatial resolution during a CEMRA exam because there is more time to acquire high spatial frequency data when the contrast agent is still present in high concentration in the arteries of interest. The 2 ms reduction in readout time reduces off-resonance blurring from chemical shift and susceptibility variation simply because there is less time for the off-resonance spins to accumulate phase.

Another aspect of the present invention is a variation in the shells sampling trajectory to aid in the acquisition of larger shells at the periphery of k-space. As shown in FIG. 6, as the shells get larger, it becomes more difficult to cover the "polar icecap" regions 6 and 8 of the shell 9 due to slew rate restrictions on the gradient hardware, and associated peripheral nerve stimulation of the patient due to rapidly changing gradient fields. Covering of the equatorial region of the shell up to latitudes of approximately ±45°, does not place as strict requirements on the gradient hardware. However, two relatively large "polar icecaps" at the poles of the shell are left unsampled. A straightforward design of two groups of interleaved helical spirals that both spiral about the same axis would not be able to cover both the "equatorial" and polar regions of the spherical shell. Therefore, to entirely cover larger spherical shells, the present invention uses two or more overlapping equatorial shell acquisitions 11 and 13 having the same radius, but with their central axes 15 and 17 tilted relative to each other, as illustrated in FIG. 7. A preferred method is for the axes of the two helical spiral shells to be tilted relative to each other by 90°. The two equatorial shell acquisitions therefore sample each other's unsampled polar "icecap" parts. As a result, the polar icecap regions need not be sampled by additional helical spiral interleaves. In this way, the slew rate problems associated with acquiring data at the "polar latitudes" is avoided. The overlapped parts of the two tilted interleaves will sample k-space at higher sampling rate than the rest of the shells, and the increased sampling can be used to either improve SNR, or reduce undersampling artifacts if the shell is designed to be undersampled.

Another aspect of the present invention is to quantitatively access the amount of undersampling that can be performed with a chosen pulse sequence. Consider a joint 4D k-space with three spatial $k_x$, $k_y$, $k_z$, and one temporal coordinate $k_t$. The extent of each k-space coordinate is related to the resolution along that direction, e.g., $-k_{0x} \leq k_x \leq k_{0x}$ with spatial resolution $\Delta x = 1/(2k_{0x})$. The temporal k-space coordinate is the sampling frequency f of the time series, so that $k_t = f$, and by analogy its extent is $k_{oT} = 1/(2\Delta t)$, where $\Delta t$ is the temporal resolution. The corners of this joint k-space lie inside the 4-dimensional rectangular prism.

$$-k_{0X} \leq k_x \leq k_{0X}, -k_{0Y} \leq k_y \leq k_{0Y}, -k_{0Z} \leq k_z \leq k_{0Z}, -k_{0T} \leq k_t \leq k_{0T} \quad (1);$$

while lying outside the 4-dimensional ellipsoid:

$$\left(\frac{k_x}{k_{0X}}\right)^2 + \left(\frac{k_y}{k_{0Y}}\right)^2 + \left(\frac{k_z}{k_{0Z}}\right)^2 + \left(\frac{k_t}{k_{0T}}\right)^2 = 1. \quad (2)$$

The sampling frequency (f) is typically expressed over a range of positive values $0 \leq f_+ \leq 2k_{oT} = 1/\Delta t$; re-arranging Eq. (2) yields the frequency extent of the 4D-ellipsoid:

$$f_+ = \frac{1}{\Delta t}\sqrt{1-\left(\frac{k_x}{k_{0X}}\right)^2-\left(\frac{k_y}{k_{0Y}}\right)^2-\left(\frac{k_z}{k_{0Z}}\right)^2}. \quad (3)$$

The content (also called "hyper-volume") of the 4D-rectangular prism defined in Eq. (1) is simply the product of the lengths of its four total extents: $16 \times k_{0X} \times k_{0Y} \times k_{0Z} \times k_{0T}$. The hyper-volume of an ellipsoid as in Eq. (2) of dimension d is given in Table 1, where $\Gamma(x)=(x-1)!$, and $\Gamma(0.5)=\pi^{1/2}$. From Table 1, it can be seen that as the dimensionality d increases, the relative content in the corners of k-space increases rapidly. For example, if d=7 (e.g., 3 spatial, 3 velocity-encoded, and 1 temporal axis) then 96.3% of the content lies in the corners, offering a 25-fold acceleration. This rapid convergence towards 100% can be verified by applying Stirling's approximation for the gamma function.

For a Cartesian 3D acquisition, unlike a shells acquisition, each of the data readouts follows a parallel path in k-space that extends from the minimum to the maximum value of kx (or vice versa) and passes though kx=0. Consequently, most implementations of Cartesian 3D acquisitions use identical readouts for each view, regardless of the location in k-space specified by $k_y$ and $k_z$. As a result, the variable $k_x$ does not play a role in determining the sampling frequency, and Eq. (3) reduces to:

$$f_+ = \frac{1}{\Delta t}\sqrt{1-\left(\frac{k_y}{k_{0Y}}\right)^2-\left(\frac{k_z}{k_{0Z}}\right)^2}. \quad (4)$$

From Eq. (4) it is apparent that the method can still be applied to Cartesian acquisitions, but the effective dimension of the problem is reduced by one.

TABLE 1

| Dimension d | Content of inscribed Hyper-ellipsoid | Content in corners (% of content of hyper-rectangle) |
|---|---|---|
| 1 | $2k_{0X}$ | 0 |
| 2 | $\pi k_{0X} k_{0Y}$ | 21.5 |
| 3 | $\frac{4\pi}{3} k_{0X} k_{0Y} k_{0Z}$ | 47.6 |
| 4 | $\frac{1}{2}\pi^2 k_{0X} k_{0Y} k_{0Z} k_{0T}$ | 69.2 |
| D | $\frac{2}{d}\frac{\pi^{d/2} k_{0X} k_{0Y}\ldots k_{0d}}{\Gamma(d/2)}$ | $100 \times \left(1 - \frac{\pi^{d/2}}{d 2^{d-1}\Gamma(d/2)}\right)$ |

BRIEF DESCRIPTION OF THE DRAWINGS

FIG. 2 is a central k-space shell sampling trajectory;

FIG. 3 is a larger, peripheral k-space shell sampling trajectory;

DETAILED DESCRIPTION OF THE PREFERRED EMBODIMENT

Figure 1:
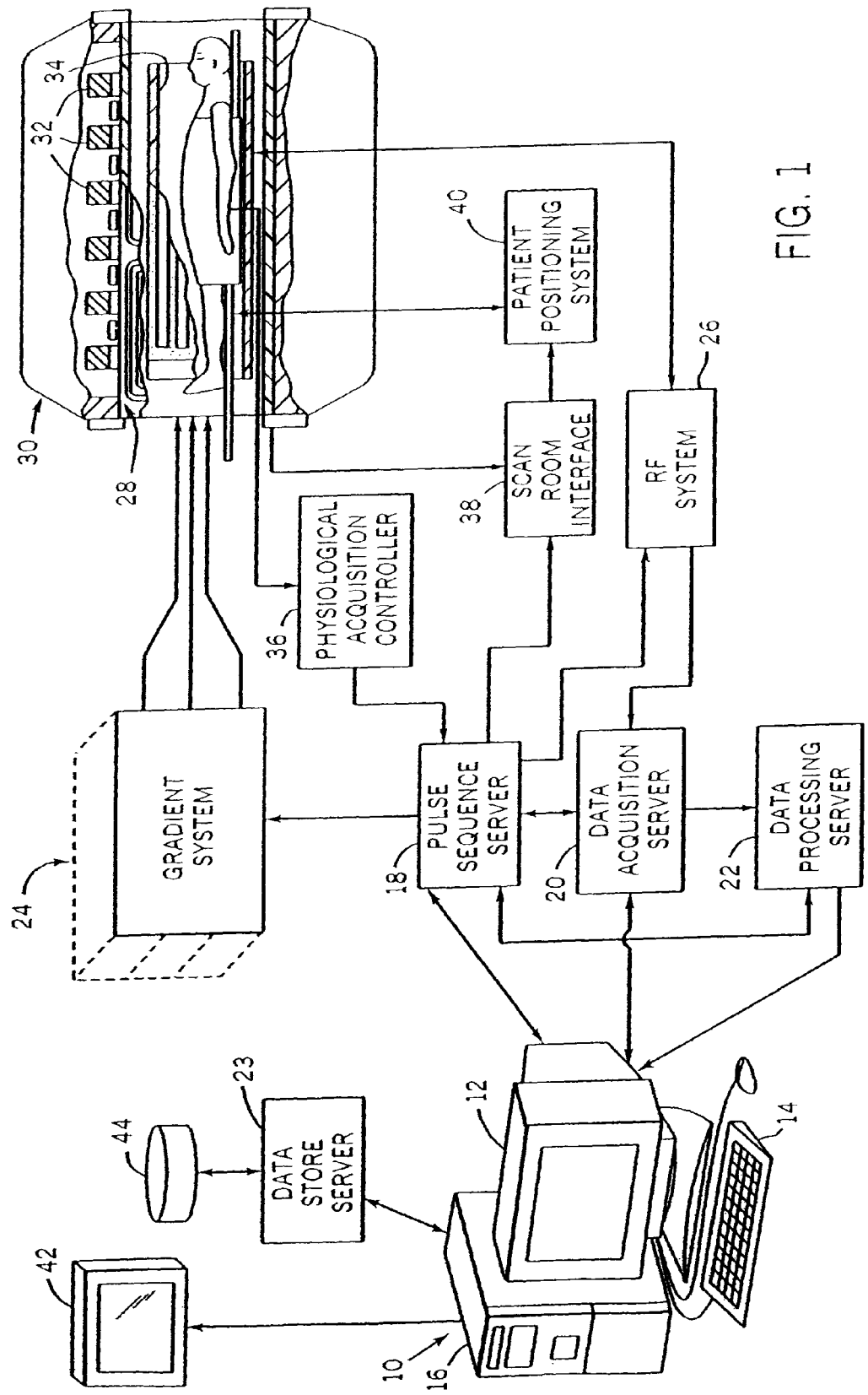
FIG. 1 is a block diagram of an MRI system which is employed to practice the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$, and $G_z$ used for position encoding NMR signals. The gradient coil assembly 28 forms part of a magnet assembly 30 which includes a polarizing magnet 32 and a whole-body RF coil 34. The gradients are capable of 33 mT/m amplitude and a slew rate of 120 T/m/s, but some MRI systems are more powerful and may have, for example up to 50 mT/m and 200 T/m/s.)

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2}, \quad (5);$$

and the phase of the received NMR signal may also be determined:

$$\phi=\tan^{-1}Q/I. \quad (6).$$

It is this phase $\phi$ that is modulated in the acquired k-space data to make the motion corrections described below.

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data are lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data are acquired and used to calibrate the pulse sequence performed by the pulse sequence server 18. Also, navigator signals may be acquired during a scan and used to adjust RF or gradient system operating parameters or to control the view order in which k-space is sampled. Typically, however, additional navigator signals are not acquired with shells acquisitions due to their inherent motion correction properties. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: a regridding step which produces a Cartesian grid of k-space data from k-space data acquired with a shells sampling trajectory; Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 4:
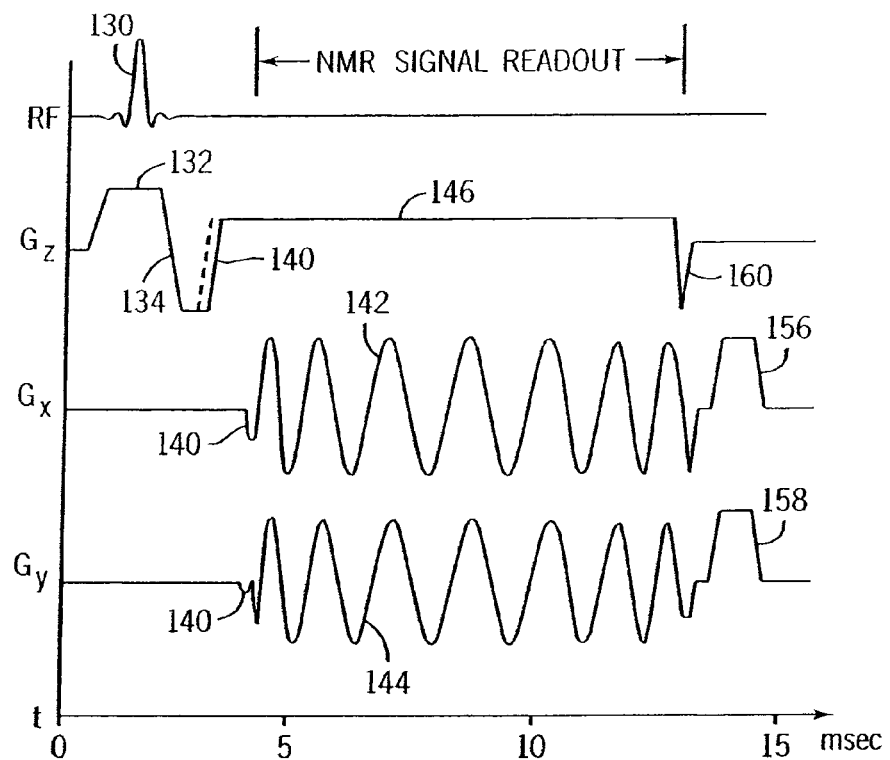
FIG. 4 is a pulse sequence employed by the MRI system of FIG. 1 to acquire MRI data using a shell sampling trajectory.
Figure 5:
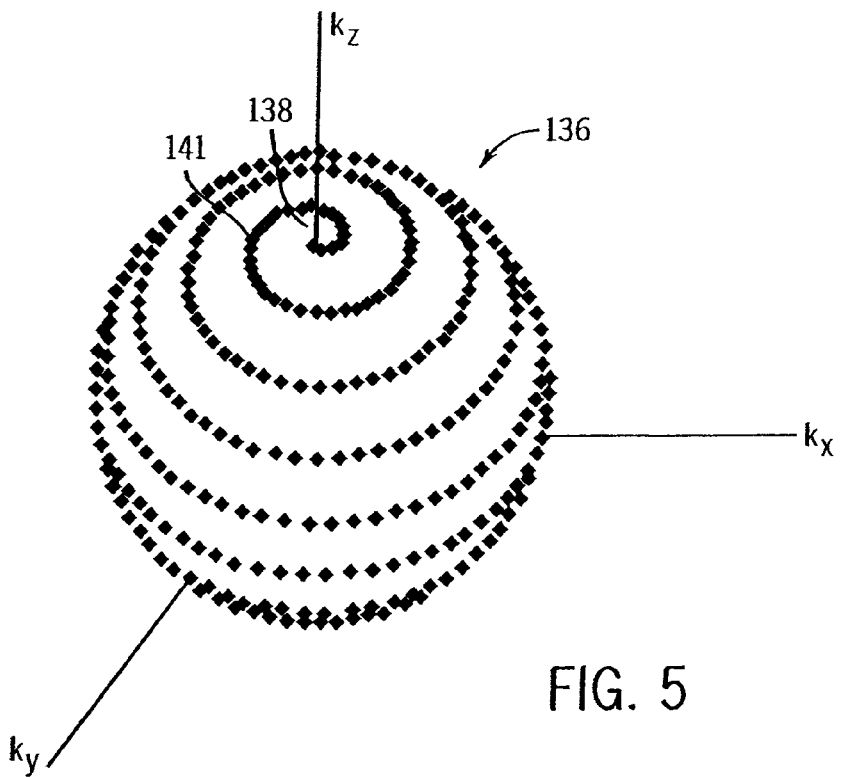
FIG. 5 is a shell sampling trajectory.

Referring particularly to FIGS. 4 and 5, the shells pulse sequence includes a volume selective RF excitation pulse 130 which is produced in the presence of a $G_z$ slab select gradient pulse 132 to produce transverse magnetization throughout the region being imaged. This is followed by a $G_z$ rephasing pulse 134 which typically has one-half of the area of $G_z$ slab select gradient pulse 132. The rephasing pulse area can be less then one-half the area of the slab select pulse for certain types of RF excitation pulses, such as minimum phase pulses. The three gradient fields $G_x$, $G_y$ and $G_z$ are then manipulated during signal readout to sample three-dimensional k-space on the surface of a sphere 136 centered at the origin of k-space and having a radius $K_\rho$.

The spherical surface 136 is sampled by a helical spiral trajectory which starts at a point 138 where $k_z=k_\rho$, spirals down to the opposite side, or pole, of the sphere where $k_z=-k_\rho$. The starting point is established by prephasing gradient pulses 140, and the downward spiral sampling trajectory 141 is produced by sinusoidal $G_x$ and $G_y$ readout gradients 142 and 144 in the presence of a small amplitude, $G_z$ gradient 146. The $G_x$ and $G_y$ readout gradients 142 and 144 vary sinusoidally to produce the helical spiral sampling pattern 141. The helical spiral sampling pattern 141 is designed such that the surface of the sphere 136 is sampled substantially uniformly throughout. The readout is followed by rewinder gradients 156, 158, and 160 to bring the sampling trajectory back to the k-space origin. This pulse sequence is repeated at the prescribed transmit repeat time ("TR") to sample k-space and acquire a k-space image data set.

The gradient waveforms for a pole-to-pole shell trajectory are derived from the k-space trajectory by the following equations:

$$G_x(t) = \frac{2\pi}{\gamma} \frac{dk_x}{dt} \quad (7)$$

$$G_y(t) = \frac{2\pi}{\gamma} \frac{dk_y}{dt} \quad (8)$$

$$G_z(t) = \frac{2\pi}{\gamma} \frac{dk_z}{dt} \quad (9)$$

Figure 6:
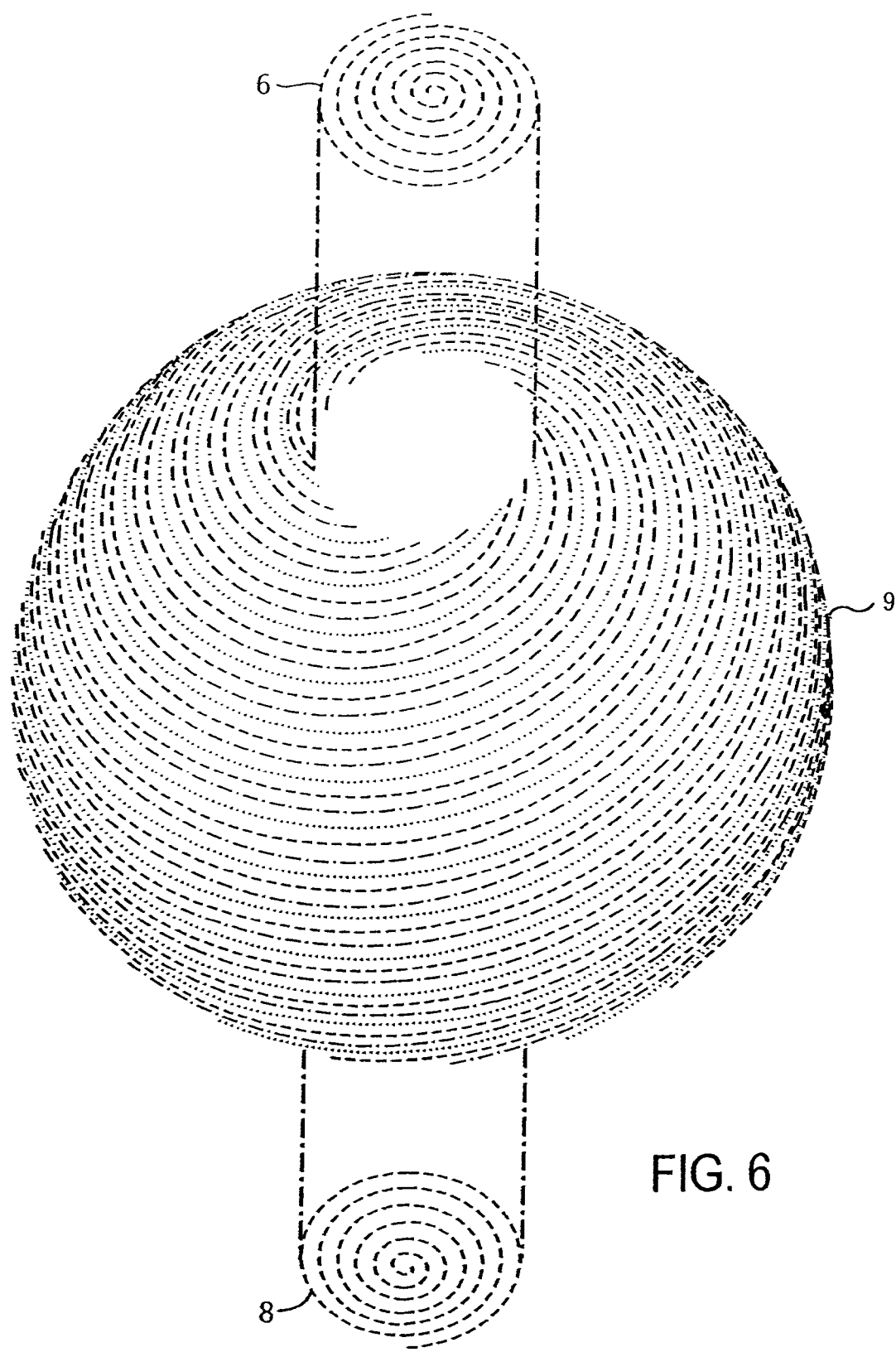
FIG. 6 is a shell sampling trajectory.
Figure 7:
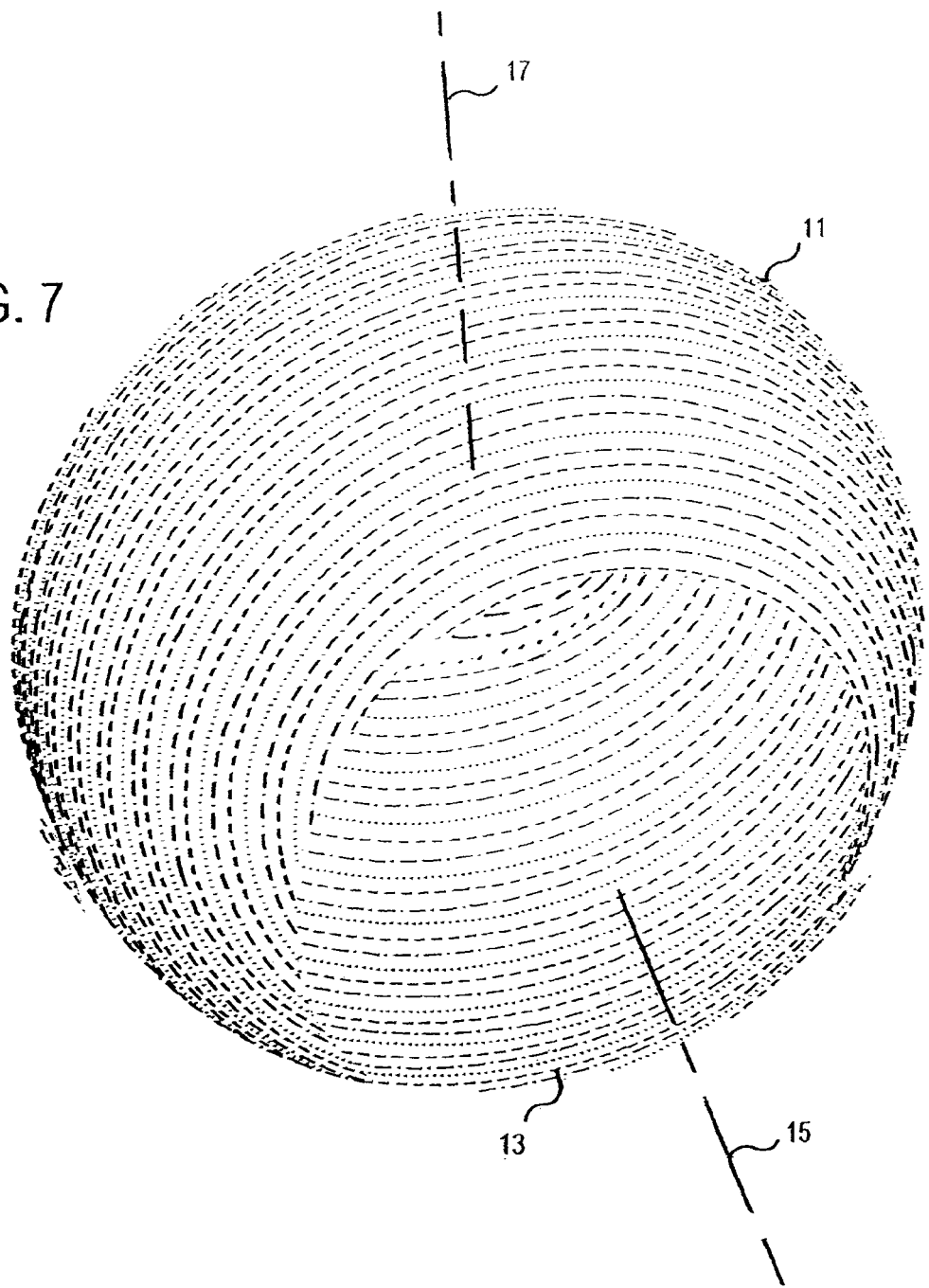
FIG. 7 is a pair of shell sampling trajectories tilted with respect to each other according to one aspect of the present invention.

At larger k-space radiuses a plurality ($M_s$) of interleaved shells trajectories are acquired by repeating the above pulse sequence. This is achieved by repeating the above pulse sequence but changing the azimuthal angle at which the trajectory leaves the starting point. Also, in the preferred embodiment sampling starts and stops a distance from each pole when the gradient slew rate limits are reached as shown in FIG. 6. Instead of sampling these polar regions 6 and 8 directly, a second shells pulse sequence is performed at the same radius as shown in FIG. 7. In this "tilted" shell acquisition the central axis 15 is tilted with respect to the first central axis 17 at this shell radius. This is achieved in the preferred embodiment by simply exchanging $G_z$ and $G_x$ gradient waveforms for one TR at this shell radius.

The shells sampling trajectory is a 3D non-Cartesian trajectory that can offer improved data acquisition efficiency compared to the Cartesian trajectory. Undersampling can be used in conjunction with the spherical shells k-space trajectory to further accelerate the acquisition for time-constrained applications. The undersampled shells technique has several clinical applications. In phase contrast angiography, the phase difference subtraction removes many undersampling artifacts. Also, applications where the target anatomy has high contrast, such as gadolinium-enhanced MR angiography, offers good immunity to undersampled artifacts. The shells trajectory is also of particular interest for MR angiography because its sampling pattern of small to large radii mimics the 3D elliptical centric view order that provides excellent venous suppression.

A k-space image data set is acquired by repeating the shells pulse sequence at the prescribed TR to sample k-space at successively larger radii. As indicated above, the TR is changed for the smaller shells by reducing the number of k-space samples acquired during each NMR signal readout. For larger shells, longer TRs are used to sample each prescribed radius and interleaved repetitions of the pulse sequence may be performed to adequately sample k-space. These repetitions of the shells pulse sequence at the same radius increase the sampling density at the larger shell radii, and may include the tilting of the shell sampling patterns to cover the polar regions at each radius.

Figure 8:
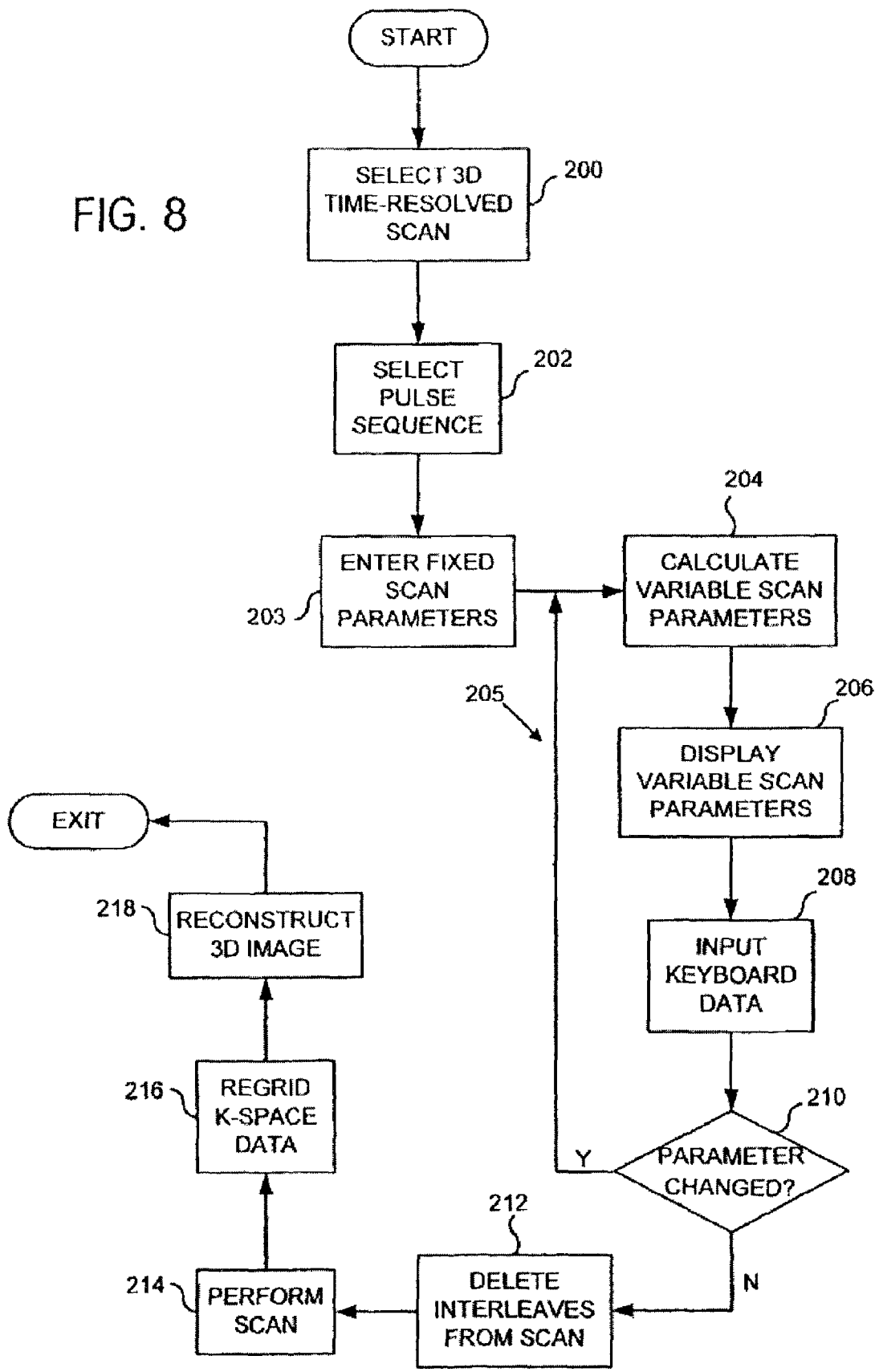
FIG. 8 is a flow chart of a preferred scan which practices the present invention.

The above-described pulse sequence may be used in a time-resolved scan in which a series of image frames are acquired as rapidly as possible. Referring particularly to FIG. 8, the time-resolved scan is selected at process block 200 and a pulse sequence that is to be used is selected at process block 202. In the preferred embodiment the above-described shell pulse sequence is used and a number of fixed scan parameters such as flip angle and field of view are entered as indicated at process block 203.

A loop 205 is then entered in which other scan parameters such as temporal resolution and spatial resolution are prescribed. The above Eqn. (3) provides a quantitative criterion to specify which time-frames are most important to acquire in various regions of the spatial k-space. According to Eqn. (3), the center of the spatial k-space is acquired at full temporal resolution $f+=2k_{OT}$, while the periphery need only be acquired at a reduced rate. The method, however, specifies how to accelerate the acquisition quantitatively, and is model-independent. Temporal resolution requirements may dictate that data are sampled less frequently than suggested by Eqn. (3), but that equation provides a criterion to determine when loss of spatial-temporal resolution can be expected, i.e., whenever data inside the hyper-ellipsoid are not acquired (unless special methods like partial Fourier transformation reconstruction or parallel imaging are employed).

Although the criterion of Eqn. (3) is quite general, it does assume that the spatial-temporal FOV roughly matches the properties of the object. For example, consider a simple 2D case, where data in the corner of the kx-ky space are often apodized, or not acquired at all. The robustness of that method has been validated through years of clinical use, yet it could in principle produce poor results if the 2D FOV is selected to be much too large, so that the object (e.g., the entire head) becomes a point source and the raw data power is no longer concentrated in the center of k-space. By analogy, the validity of the method relies on avoiding unreasonable selections for the number of time frames and the temporal resolution $\Delta t$.

Variable scan parameters are entered at process block 204. The variable scan parameters are those which can be changed to affect the spatial readout time resolution of the scan. The user enters these parameters and Eqn. (3) is used to calculate the effect. The results are displayed at process block 206 and the user is prompted to make changes or to approve the scan parameters at process block 208. The trade-off between spatial and temporal resolution can be accurately controlled by adjusting the multi-dimensional k-space cutoff radius parameter $K_c$. For an n-dimensional acquisition $k_c$ can range continuously from 0 to $k_0 \times \sqrt{n}$ where $k_0$ is the radius of the inscribed sphere. For example, for a three-dimensional time resolved acquisition, n=4 because there are three spatial and one temporal directions. So $K_c$ can range from 0 to $2 \times k_0$. By setting $K_c = k_0$, we avoid having to acquire 70% of the data, while introducing negligible image artifacts. The user can change scan parameters and quantitatively observe the results and make further changes if desired.

When the user approves the selection of scan parameters as indicated at decision block 210 the degree of undersampling is set and the corresponding number of interleaves can be deleted from the scan as indicated in process block 212. This is done by deleting interleaved shell trajectories at larger k-space radii as described in co-pending U.S. patent application Ser. No. 11/341,242, filed on Jan. 27, 2006, and entitled "Under-Sampled 3D MRI Using a Shells K-Space Sampling Trajectory". The scan is then performed as indicated at process block 214.

A standard 3D image reconstruction may be used to produce an image from the acquired k-space data. At process block 216, the acquired k-space data is regridded. In the preferred embodiment the acquired k-space data are regridded onto a 3D Cartesian coordinate system using a method described by Jackson J I, Meyer C H, Nishimura D G, Macovski A, Selection Of A Convolution Function For Fourier Inversion Using Gridding [Computerised Tomography Application], Medical Imaging, IEEE Transactions on 1991; 10(3):473-478. However, three-dimensional Voronoi cells described by Rasche V, Proksa R, Sinkus R, Bornert P, Eggers H, Resampling Of Data Between Arbitrary Grids Using Convolution Interpolation, Medical Imaging, IEEE Transactions on 1999; 18(5):385-392, were used to calculate the density compensation factors. Due to the relatively complicated geometry of the shells trajectory, we were not able to derive a closed-form analytical expression for the density compensation function. Instead, the volume of each Voronoi cell was calculated numerically using MatLab 7 (The MathWorks, Natwick, Mass.) using the k-space points that are sampled along the trajectory given by Eqns. (1)-(3) along with the tilted interleaves that cover the "polar ice caps". The volume of the Voronoi cell associated with each k-space sampling location is used for the density compensation estimate. The evaluation of the density compensation factors requires approximately one hour of CPU time, but it is only calculated once for this shells trajectory, and then stored for repeated use. A standard Kaiser-Bessel convolution kernel covering four times the grid space is used. To reduce aliasing artifacts, the grid dimension is chosen to be the next highest power of two (i.e., 256) compared to the number of samples, which is equal to twice the number of shells $2 \times N_s$ which equals 180 when 90 shells are acquired. As indicated at process block 218, a complex three-dimensional inverse Fourier transformation is then performed on the regridded data to produce a 3D image frame. This image reconstruction process is performed on each image frame data set acquired during the dynamic study.

Therefore, optimal imaging parameters can be readily selected based on a subset of fixed parameters using the above-described formula. MRI k-space data are acquired using a series of shell k-space sampling trajectories of different radii. Off-resonance effects are reduced and fat-suppression can be improved by using a shorter TR for pulse sequences that sample at smaller radii. At larger radii sampling is repeated with the central axis of the shell sampling trajectory tilted such that the polar regions of shells acquired at the same radii are sampled by the other shell.

The present invention has been described in terms of the various embodiments, and it should be appreciated that many equivalents, alternatives, variations, and modifications, aside from those expressly stated, are possible and within the scope of the invention. Therefore, the invention should not be limited to a particular described embodiment.

The invention claimed is:

1. A method for prescribing a scan on an MRI system, the steps comprising:
    a) selecting a general pulse sequence to be used during a time-resolved imaging process of a subject using an MRI system;
    b) setting a first set of scan parameters to more specifically prescribe the general pulse sequence;
    c) setting a second set of scan parameters using a formula that relates time resolution and spatial resolution resulting from the first set of scan parameters;
    d) performing the time-resolved imaging process using the general pulse sequence, the first set of scan parameters, and the second set of scan parameters;
    wherein the general pulse sequence employs a shell k-space sampling trajectory of a prescribed radius and a prescribed transmit repeat time (TR) between repetitions of the general pulse sequence throughout the time-resolved imaging process and wherein the TR varies between at least some shell k-space sampling trajectories; and
    wherein repetitions of the general pulse sequence throughout the time-resolved imaging process are performed using different prescribed radii between at least some shell k-space sampling trajectories and wherein the prescribed TR for small radii shell trajectories is shorter than the prescribed TR for large radii shell trajectories.

2. The method of claim 1 wherein the first set of scan parameters includes a number of fixed scan parameters including a flip angle and field of view.

3. The method of claim 1 wherein step c) includes setting variable scan parameters including temporal resolution and spatial resolution using the formula and the first set of scan parameters.

4. The method of claim 1 wherein the second set of scan parameters include scan parameters that can be changed to affect the spatial readout time resolution of the time-resolved scan.

5. The method of claim 1 wherein the formula controls a trade-off between spatial and temporal resolution of the time-resolved imaging process by adjusting a multi-dimensional k-space cutoff radius parameter, $K_c$.

6. The method of claim 1 wherein the formula provides a quantitative criterion to specify particular time-frames in the time-resolved imaging process acquired using the general pulse sequence with the first set of scan parameters in various regions of the spatial k-space.

7. The method of claim 1 wherein the formula is:

$$f_t = \frac{1}{\Delta t}\sqrt{1 - \left(\frac{k_x}{k_{0x}}\right)^2 - \left(\frac{k_y}{k_{0y}}\right)^2 - \left(\frac{k_z}{k_{0z}}\right)^2}$$

where:
    $k_{0x}$=extent of k-space sampling along x-axis;
    $k_{0y}$=extent of k-space sampling along y-axis;
    $k_{0z}$=extent of k-space sampling along z-axis;
    $\Delta t$=temporal resolution of acquired image frames;
    $k_x$, $k_y$, and $k_z$=k-space spatial coordinate values; and
    $f_t$=is the sampling frequency of acquired image frames.

8. The method of claim 7 wherein step d) includes a Cartesian acquisition and wherein $k_x$ is sampled along a parallel path for each readout so that the formula reduces to:

$$f_t = \frac{1}{\Delta t}\sqrt{1 - \left(\frac{k_y}{k_{0y}}\right)^2 - \left(\frac{k_z}{k_{0z}}\right)^2}.$$

9. The method of claim 1 wherein the second set of scan parameters is selected to determine a degree of undersampling to include in the time-resolved imaging process.

10. A method for prescribing a scan on an MRI system, the steps comprising:
    a) selecting a general pulse sequence to be used during a time-resolved imaging process of a subject using an MRI system;
    b) setting a first set of scan parameters to more specifically prescribe the general pulse sequence;
    c) setting a second set of scan parameters using a formula that relates time resolution and spatial resolution resulting from the first set of scan parameters; and
    d) performing the time-resolved imaging process using the general pulse sequence, the first set of scan parameters, and the second set of scan parameters, wherein the general pulse sequence employs a shell k-space sampling trajectory of a prescribed radius and a prescribed transmit repeat time (TR); and
    wherein step d) includes repeatedly performing the general pulse sequence using the first set of scan parameters and the second set of scan parameters a plurality of times at different prescribed radii to acquire a k-space image data set, and wherein the prescribed TR for small radii shell trajectories is shorter than the prescribed TR for large radii shell trajectories.

11. The method of claim 10 further comprising step e) reconstructing an image of the subject from the k-space image data set.

12. The method of claim 10 wherein peripheral k-space is sampled with a plurality of interleaved shell trajectories, each having a respective radius.

13. The method of claim 12 wherein step d) includes deleting interleaved shell trajectories in accordance with the result of step c).

14. The method of claim 12 wherein each respective radius of the interleaved shell trajectories have the same radius.

15. The method of claim 12 wherein each repetition of the general pulse sequence has a prescribed readout time and the readout time for small radii shell trajectories is shorter than the readout time for large radii shell trajectories.

16. A magnetic resonance imaging (MRI) system comprising:
- a magnet system configured to generate a polarizing magnetic field about at least a portion of a subject;
- a plurality of gradient coils configured to apply a gradient field to the polarizing magnetic field;
- a radio frequency (RF) system configured to apply an excitation field to the subject and acquire MR image data therefrom;
- a computer system programmed to:
    - select a general pulse sequence to be used during a time-resolved imaging process of a subject using the MRI system;
    - set a first set of scan parameters to more specifically prescribe the general pulse sequence;
    - set a second set of scan parameters using a formula that relates time resolution and spatial resolution resulting from the first set of scan parameters;
    - perform the time-resolved imaging process using the general pulse sequence, the first set of scan parameters, and the second set of scan parameters, wherein the general pulse sequence employs a shell k-space sampling trajectory of a prescribed radius and a prescribed transmit repeat time (TR); and
    - wherein performing the time-resolved imaging process includes repeatedly performing the general pulse sequence using the first set of scan parameters and the second set of scan parameters a plurality of times at different prescribed radii to acquire a k-space image data set, and wherein the prescribed TR for small radii shell trajectories is shorter than the prescribed TR for large radii shell trajectories.

17. The system of claim 16 wherein the computer system is further programmed to sample peripheral k-space with a plurality of interleaved shell trajectories, each having a respective radius.

18. The system of claim 16 wherein the computer system is further programmed to perform each repetition of the general pulse sequence with a prescribed readout time such that the readout time for small radii shell trajectories is shorter than the readout time for large radii shell trajectories.

* * * * *